(12) United States Patent
Hsu et al.

(10) Patent No.: US 9,905,605 B2
(45) Date of Patent: Feb. 27, 2018

(54) PHASE DETECTION AUTOFOCUS TECHNIQUES

(71) Applicant: Taiwan Semiconductor Manufacturing Co., Ltd., Hsin-Chu (TW)

(72) Inventors: Wen-I Hsu, Tainan (TW); Dun-Nian Yaung, Taipei (TW); Feng-Chi Hung, Chu-Bei (TW); Keng-Yu Chou, Kaohsiung (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 36 days.

(21) Appl. No.: 14/883,849

(22) Filed: Oct. 15, 2015

(65) Prior Publication Data

US 2017/0110501 A1 Apr. 20, 2017

(51) Int. Cl.
*H01L 31/0232* (2014.01)
*H01L 27/146* (2006.01)

(52) U.S. Cl.
CPC .. *H01L 27/14645* (2013.01); *H01L 27/14605* (2013.01); *H01L 27/14621* (2013.01);
(Continued)

(58) Field of Classification Search
CPC ......... H01L 27/14627; H01L 27/14623; H01L 27/14621; H01L 27/14685; H01L 27/1464;
(Continued)

(56) References Cited

U.S. PATENT DOCUMENTS 8,378,399 B2 * 2/2013 Maeda ............... H04N 5/37457
257/292
8,525,917 B2 9/2013 Taniguchi
(Continued)

OTHER PUBLICATIONS

Kobayashi, et al. "A Low Noise and High Sensitivity Image Sensor with Imaging and Phase-Difference Detection AF in All Pixels." 2015 International Image Sensor Workshop (IISW). Published Jun. 8, 2015. Retrieved from http://www.imagesensors.org/Past%20Workshops/2015%20Workshop/2015%20Papers/Sessions/Session_1/1-03-M.Kobayashi_Canon_IISW2015.pdf.

*Primary Examiner* — Bradley K Smith
*Assistant Examiner* — David Goodwin
(74) *Attorney, Agent, or Firm* — Eschweiler & Potashnik, LLC

(57) ABSTRACT

The present disclosure relates to an image sensor having autofocus function and associated methods. In some embodiments, the integrated circuit has a photodiode array with a plurality of photodiodes disposed within a semiconductor substrate and a composite grid overlying the photodiode array and having a first plurality of openings and a second plurality of openings extending vertically through the composite grid. The integrated circuit further has an image sensing pixel array with a plurality of color filters disposed in the first plurality of openings. The integrated circuit further has a phase detection pixel array having a plurality of phase detection components that are smaller than the plurality of color filters and that have a low refractive index (low-n) material with a refractive index (n) smaller than a refractive index of the plurality of color filters, wherein the phase detection components are disposed in the second plurality of openings.

20 Claims, 8 Drawing Sheets

(52) U.S. Cl.
CPC .. *H01L 27/14627* (2013.01); *H01L 27/14636* (2013.01); *H01L 27/14685* (2013.01)

(58) Field of Classification Search
CPC ........... H01L 27/14605; H01L 27/1463; H01L 27/14643
See application file for complete search history.

(56) References Cited

U.S. PATENT DOCUMENTS

| | | | | |
|---|---|---|---|---|
| 2013/0015545 | A1* | 1/2013 | Toumiya | H01L 27/14605 257/432 |
| 2015/0035100 | A1* | 2/2015 | Tanida | H01L 27/14623 257/432 |
| 2015/0035104 | A1* | 2/2015 | Horikoshi | H01L 27/14627 257/432 |
| 2016/0343753 | A1* | 11/2016 | Asatsuma | H01L 27/14621 |
| 2017/0047363 | A1* | 2/2017 | Choi | H01L 27/1463 |
| 2017/0077163 | A1* | 3/2017 | Chou | H01L 27/14627 |

* cited by examiner

PHASE DETECTION AUTOFOCUS TECHNIQUES

BACKGROUND

Optical imaging sensors are widely employed in today's electronic devices from digital cameras to other portable devices. An optical image sensor includes an array of sensing pixels and supporting logic circuitry that converts optical images to digital data. Performance of the optical image sensor can be improved by improving light sensing of individual pixels, crosstalk between pixels, and/or algorithms used by the supporting logic circuitry. However, the optical image sensor cannot perform well if the image is out of focus. Therefore, phase detection pixels are incorporated in optical image sensors to automatically locate where a lens should focus, without blindly scanning the whole range to try to detect a correct position for the lens.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
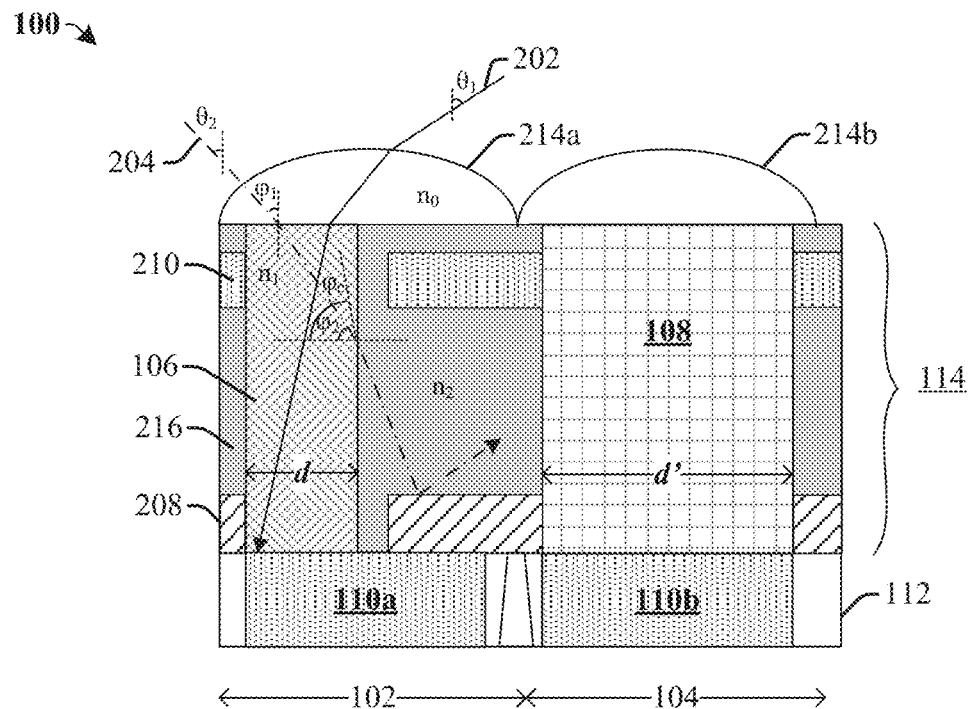
FIG. 1 illustrates a cross-sectional view of some embodiments of an integrated circuit including image sensing pixels and phase detection pixels.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

An image sensor with autofocus function comprises a pixel array including image sensing pixels and a plurality of incorporated phase detection pixels. A photodiode array is arranged within a semiconductor substrate below the pixel array, and a composite grid is arranged over the photodiode array. The composite grid laterally surrounds color filters corresponding to the image sensing pixels and phase detection components corresponding to the phase detection pixels. The composite grid advantageously increases sensitivity (e.g., quantum efficiency) and reduces cross-talk between adjacent image sensing pixels.

However, the composite grid may also reduce angular response sensitivity (over incident angles) of the phase detection pixels by unwanted total internal reflection off sidewalls of the composite grid. For example, incident radiation passing into a phase detection component may be reflected off of sidewalls of the composite grid before being provided to an underlying photodiode, depending on incident angle and relative reflective index of the dielectric grid and the phase detection component. The reflected radiation reduces an angular response of the phase detection pixel since photodiode receives reflected radiation having different incident angles, thereby negatively affecting the phase detection of the pixel.

The present disclosure relates to phase detection autofocus (PDAF) techniques including autofocus image sensors and associated sensing methods to achieve good angular response. In some embodiments, the composite grid of an autofocus image sensor comprises a first plurality of openings for color filters and a second plurality of openings for phase detection components. In some embodiments, a width of the second plurality of openings is smaller than the width of the first plurality of openings. The second plurality of openings is vertically misaligned to microlens arranged thereon, such that a radiance intensity received by the phase detection components is dependent on incident angles. In some other embodiments, the phase detection component has a refractive index smaller than a refractive index of the color filters. The smaller refractive index reduces the total internal reflection within the phase detection component thereby improving the angular response of the autofocus image sensor.

FIG. 1 shows a cross-sectional view 100 of an integrated circuit for an autofocus image sensor including image sensing pixels 104 and phase detection pixels 102 according to some embodiments.

As shown in cross-sectional view 100, a photodiode array comprising a plurality of photodiodes 110a, 110b is disposed within a semiconductor substrate 112. A composite grid 114 is disposed over the semiconductor substrate 112. The composite grid 114 comprises a first opening having a first width d' and a second opening having a second width d that is smaller than the first width d' so that the phase detection component 106 has a smaller size than the color filter 108. A color filter 108 is disposed in the first opening of the composite grid 114 and a phase detection component 106 is disposed in the second opening of the composite grid 114. In some embodiments, the second width d may be less than or equal to one-half the first width d'. The smaller size of the phase detection component 106 increases angular discrimination of incident radiation 202. The color filter 108 is centered upon an overlying microlens 214b (i.e., an axis bisecting a width of the color filter 108 is aligned with an axis bisecting a width of the microlens 214b disposed thereon), while the phase detection component 106 is not centered upon an overlying microlens 214a. In some embodiments, the color filter 108 is centered upon the underlying photodiode 110b (i.e., an axis bisecting a width of the color filter 108 is aligned with an axis bisecting a width of the photodiode 110b disposed underneath), while the phase detection component 106 is not centered upon the underlying photodiode 110a.

In some embodiments, the composite grid 114 comprises a metal grid structure 208 and a dielectric grid structure overlying the metal grid structure 208. In some embodiments, the dielectric grid structure may comprise a first kind of dielectric grid 210, for example, a silicon nitride or silicon oxynitride grid, surrounded by a second kind of dielectric grid 216, for example, a silicon dioxide grid.

The phase detection component 106 is configured to selective transmit incident radiation to an underlying photodiode 110a, depending upon an incident angle of the incident radiation, so that the phase detection pixel 102 will detect a radiation peak at a peak incident angel $\theta_1$ not equal to zero (an incident angle of zero means vertical incidence) and detect a decreasing radiation at a selected range of incident angles as incident angles being away from the peak incident angle. For example, a first incident radiance 202 with the peak incident angel $\theta_1$ will pass through the phase detection component 106 and be received by photodiode 110a, while a second incident radiance 204 with a second incident angle $\theta_2$ will be reflected away from photodiode 110a by the composite grid 114.

The phase detection component 106 is configured to improve angular discrimination of incident radiation 204 by reducing radiation that is reflected to the phase detection component 106 by sidewalls of the composite grid 114. In some embodiments, the phase detection component 106 may comprise a low refractive index (low-n) material having a refractive index (n) smaller than a refractive index of the color filter 108. In some embodiments, the phase detection component 106 can have a refractive index close or even smaller than a refractive index of the dielectric grid 216. In some embodiments, the phase detection component 106 can be a same material as the dielectric grid 216. In some embodiments, the phase detection component 106 may comprise an optically transparent material, such that incident radiance of a broad wavelength range can be received and sensitivity of the phase detection pixels is improved. In other embodiments, the phase detection component 106 may comprise same material as some color filters such as green color filters.

The low-n material will improve angular discrimination by reducing reflection within the phase detection component 106. The low-n material reduces reflection by decreasing an incident angle $\phi_2$ at which an incident radiation (e.g. the incident radiation 204) will strike the sidewalls of the composite grid 114 ($\phi_2 = \pi/2 - \arcsin(\sin \phi_1 * (n_0/n_1)$), wherein $n_0$ is a refractive index of the microlens 214a, $n_1$ is a refractive index of the phase detection component 106 and $\phi_1$ is an incident angle from the microlens 214a to the phase detection component 106). When the incident angle $\phi_2$ is smaller than a critical angle $\phi_c$ incident radiation 204 would not be internally reflected to the photodiode 110a. The low-n material also reduces reflection by increasing the critical angle $\phi_c$ (i.e., reducing $n_1$ will increase $\phi_c$, $\phi_c = \arcsin(n_2/n_1)$, wherein $n_2$ is a refractive index of the composite grid 114, for example, of the second kind of dielectric grid 216).

Thus, the phase detection component 106 reduces unwanted reflection of incident radiation 204 due to its size and its material to improve the angular response of the phase detection pixel 102.

Figure 2:
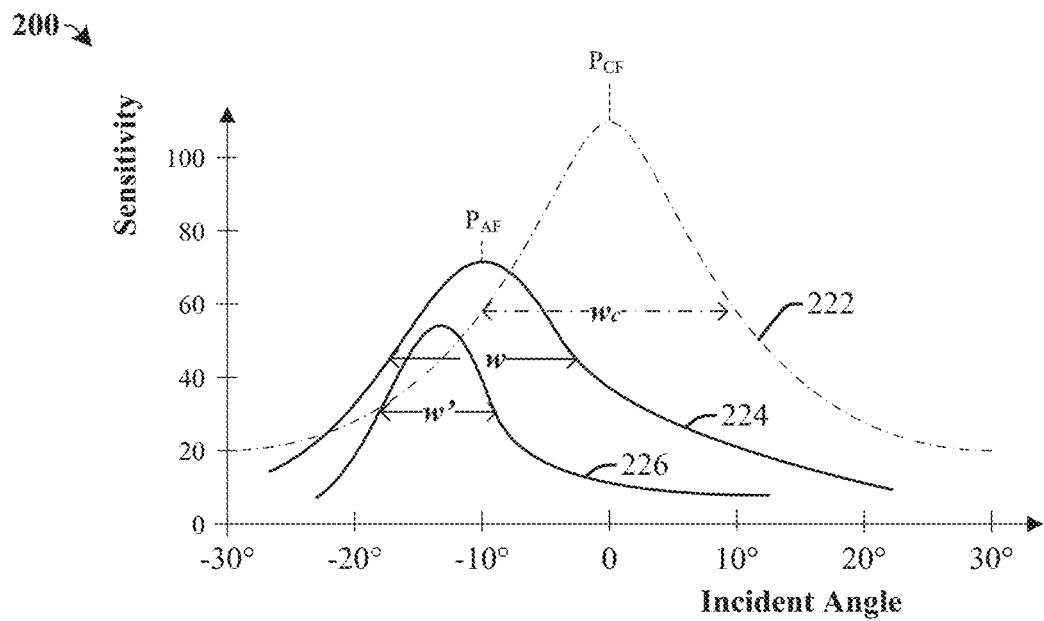
FIG. 2 illustrates a graph of some embodiments of angular response curves of an image sensing pixel and a phase detection pixel of FIG. 1 over incident angles.

FIG. 2 shows a graph 200 of some embodiments of angular response curves of the image sensing pixel 104 and the phase detection pixel 102 of FIG. 1 over incident angles. In some embodiments, as shown by a first curve 222, the image sensing pixel 104 receives incident radiance having symmetrical intensity about an intensity peak $P_{CF}$ around zero incident degree (vertical injection); while as shown by a second curve 224, a receiving peak P of the phase detection pixel 102 is shifted to around −10°.

As the width d of the phase detection component (e.g., 106 of FIG. 1) decreases, more incident radiation is reflected away from the photodiode (e.g., 110a of FIG. 1). The overall intensity of the received radiation may decrease but regular response becomes sharper, as shown by a curve 226. Widths w, w' of the regular response curves 224, 226, such as a full width at half maximum (FWHM) may also decrease. In some embodiments, the widths (e.g., w, w' of the regular response curve of the phase detection pixel 102 (e.g., 224, 226) is smaller than that of the image sensing pixel 104 (e.g., $w_c$ of the regular response curve 222).

By reducing a width of the regular response curve of the phase detection pixel angular discrimination is improved (i.e., the location of the peak is more pronounced) so that the angle of the incident radiation can be more clearly determined by the phase detection pixel 102, thereby improving the phase detection of the phase detection pixel 102.

Figure 3:
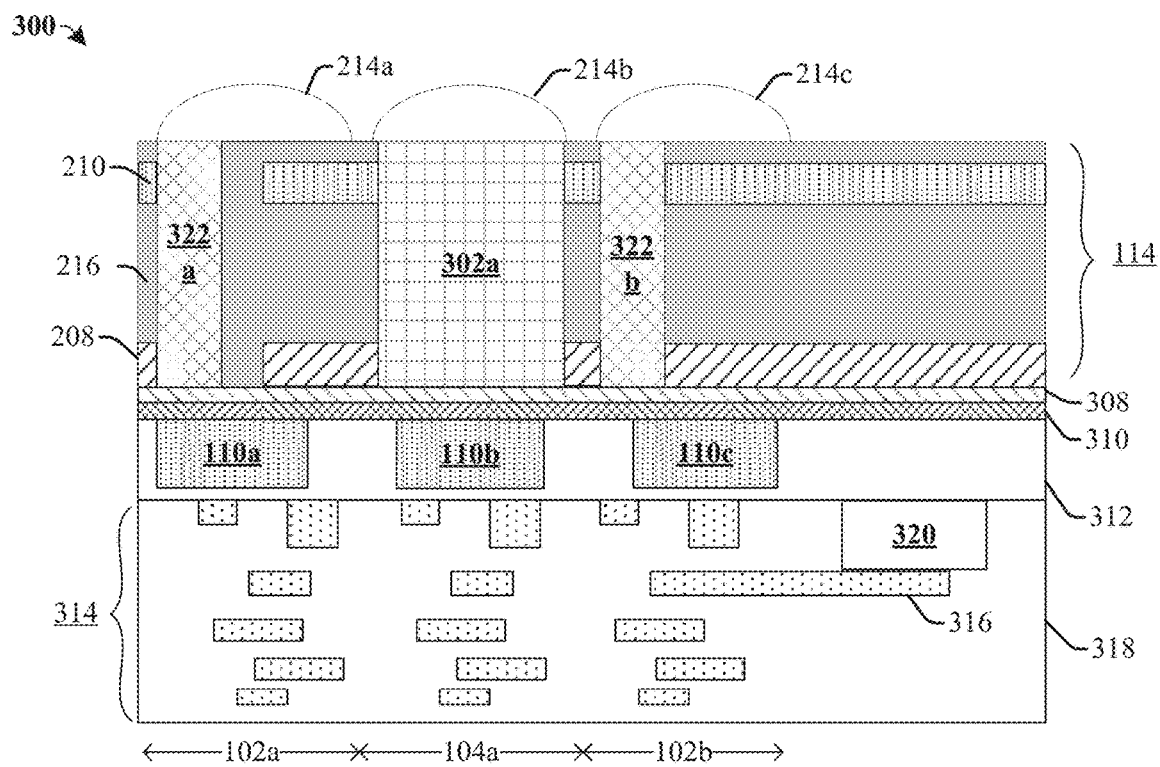
FIG. 3 illustrates a cross-sectional view of some additional embodiments of an integrated circuit including image sensing pixels and phase detection pixel.

FIGS. 3-4 show an integrated circuit including image sensing pixels and a pair of phase detection pixels according to some embodiments.

FIG. 3 shows a cross-sectional view 300 of an integrated circuit comprising a first phase detection pixel 102a, a second phase detection pixel 102b and an image sensing pixel 104a. It is appreciated that although a back illumination structure (BIS) is shown by FIG. 3, a front-illumination structure (FIS) is also amenable. In some embodiments, the image sensing pixels 104a comprises a color filter 302a and the phase detection pixels 102a, 102b respectively comprising phase detection component 322a, 322b. The color filter 302a and the phase detection components 322a, 322b are separated by a composite grid 114. In some embodiments, the composite grid 114 comprises a metal grid structure 208 and a dielectric grid structure overlying the metal grid structure 208. In some embodiments, the dielectric grid structure may comprise a first kind of dielectric grid 210 disposed between two layers of a second kind of dielectric grid 216, for example. In some embodiments, the color filter 302a and/or the phase detection components 322a, 322b are separated from the metal grid structure 208 or the second kind of dielectric grid 210 by the first kind of dielectric grid 216. In other embodiments, the metal grid structure 208 or the second kind of dielectric grid 210 reaches sidewalls of the color filter 302a or the phase detection components 322a, 322b.

In some embodiments, the image sensor further comprises a buffer layer 308 disposed under the color filter 302a, the phase detection components 322a, 322b and the composite grid 114. The image sensor can further comprise an antireflective layer 310 disposed under the buffer layer 308. A photodiode array comprising a plurality of photodiodes 110a-110c is disposed within a semiconductor substrate 312 under the color filter 302a and the phase detection components 322a, 322b. In some embodiments, width center axis of the color filter 302a is aligned with corresponding photodiodes 110b while width center axes of the phase detection components 322a, 322b are not aligned with corresponding photodiodes 110a, 110c.

In some embodiments, a back-end-of-the-line (BEOL) stack 314 is arranged under the semiconductor substrate 312 on a side of the semiconductor substrate 312 opposite the composite grid 114. The BEOL stack 314 comprises a plurality of metal interconnects 316 (e.g., copper wires and/or vias) arranged within one or more dielectric layers 318. In some embodiments, an image signal processor 320 comprising one or more semiconductor devices may be arranged within the semiconductor substrate 312 or the dielectric layers 318. The image signal processor 320 is coupled to the plurality of photodiodes 110a-110c and is configured to compute radiation intensity passing through phase detection pixels and generate a signal related to focus conditions of an image sensor.

Figure 4A:
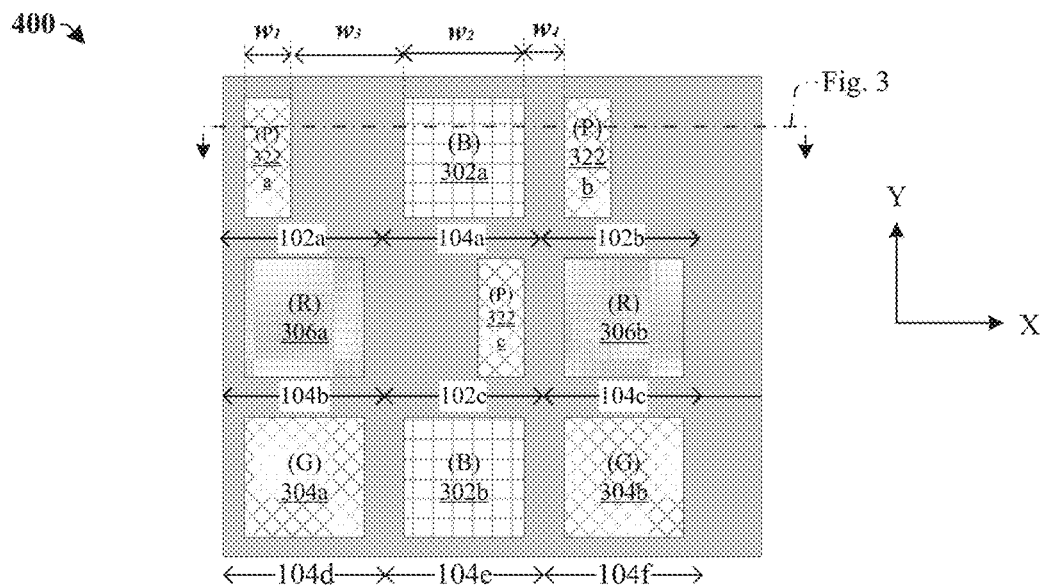
FIG. 4A illustrates a top view of some embodiments of the integrated circuit of FIG. 3.

FIG. 4A shows a top-view 400 of the integrated circuit of FIG. 3. The integrated circuit includes image sensing pixels 104 and phase detection pixels 102. As shown in top-view 400, an image sensing pixel array is arranged in rows (in the x direction) and columns (in the y-direction) comprising a plurality of image sensing pixels 104a-104f. A phase detection pixel array is also arranged in rows (in the x direction) and columns (in the y-direction) comprising a plurality of phase detection pixels 102a-102c.

Color filters 302, 304, 306 of the image sensing pixels 104 filter different spectrums of radiation. For example, for a RGB image sensor, a first color filter 302a can be configured to transmit blue light while blocking other colors; a second color filter 304a can be configured to transmit red light; and a third color filter 306a can be configured to transmit green light.

Further, the image sensing pixels 104 and the phase detection pixels 102 are often arranged to follow a predetermined pattern. An example color filter arrangement of one embodiment is shown by top-view 400, where "B" represents blue color filters; "R" represents red color filters; "G" represents green color filters; and "P" represents phase detection components. The phase detection pixels 102 are incorporated into the image sensing pixels 104. For example, the phase detection components 322 of the phase detection pixels 102 comprise green color filters and are arranged to correspond to one half of a checkerboard pattern and where the red and blue filters 306, 302 collectively establish the other half of the checkerboard pattern. In another example, the phase detection components 322 have a refractive index smaller than the color filter and could pass through a wider spectrum range than color filters. The phase detection pixels 102 are arranged in a matrix that in a single row or column, in a pair of rows or columns or in multiple rows or columns. In some embodiments, one color filter is arranged between two phase detection pixels. For example, as shown in FIG. 4A, the first color filter, a blue filter 104a is arranged between the first and second phase detection pixels 102a and 102b. In other embodiments, multiple color filters are arranged in between two neighboring phase detection pixels. The phase detection pixels 102 have a smaller width than the image sensing pixels 104. In some embodiments, a first plurality of openings within the composite grid 114 comprising the color filters 302-306 have a width $w_1$ that is more than twice as large as a width $w_2$ of a second plurality of openings within the composite grid 114 comprising the phase detection components 322 (e.g., a width of the first phase detection component 322a of the phase detection pixels 102a is less than 50% the width of the first color filter 302a of the image sensing pixels 104a). For example, the first color filter 302a could have a width around 0.8 µm and the first phase detection component 322a could have a width equal or smaller than about 0.4 µm. The smaller width of the phase detection components 322a allows for the angular discrimination of the phase detection pixels 102 to be increased. This is because a larger blocking structure off a center of microlens overlying the phase detection components 106 (e.g., a portion of composite grid 114 between the first phase detection components 322a and the first color filter 302a with a width $w_3$) will block incident radiation injected out of a smaller incident angle range.

In some embodiments, a pair of phase detection components, including the first phase detection component 322a and a third phase detection component 322c, are arranged in diagonal. The first phase detection component 322a and the second color filter 306a are aligned along left sides and offset along right sides; while the first color filter 302a and the third phase detection component 322c are offset along left sides and aligned along right sides. The color filters 302-306 and the phase detection components 322 are separated by the composite grid 114, which has a greater width $w_3$ between a color filter and a phase detection component than a width $w_4$ between two color filters.

In some embodiments, the phase detection components 322 can have a refractive index (n1) close or even smaller than a refractive index (n2) of the dielectric grid 216. In some embodiments, the phase detection components 322a can be a same material as the dielectric grid 216. The pair of phase detection pixels 102a, 102c have mirrored phase detection components 322a, 322b that cause the phase detection pixels 102a, 102c have peak responses at different incident angles. A difference between the peak responses can be used to calculate an adjustment can be made to a main lens to focus the main lens.

Figure 4B:
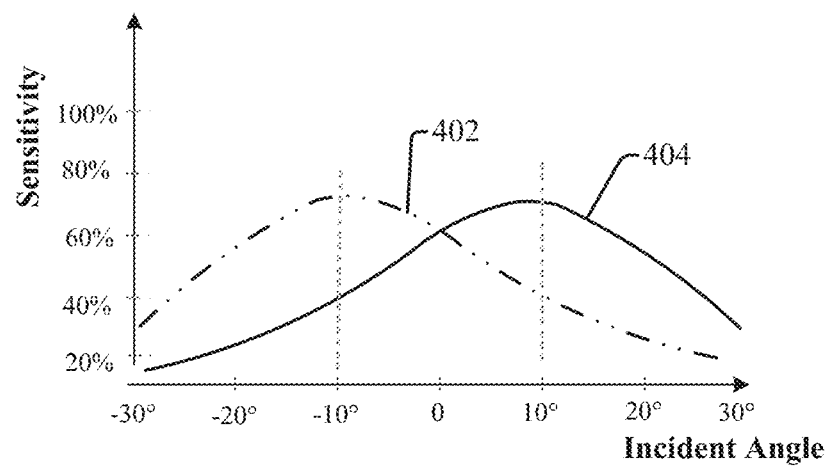
FIG. 4B illustrates some embodiments of angular response curves of a pair of phase detection pixels of FIG. 4A over incident angles.

For example, FIG. 4B shows a graph 401 of angular response curves of the pair of phase detection pixels 102a and 102c of FIG. 4A over incident angles according to some embodiments. As shown by graph 401, a first curve 402 provides an angular response of a first phase detection pixel (e.g., 102a of FIG. 4A) with a peak at around −10°, while a curve 404 provides an angular response of a second phase detection pixel (e.g., 102c of FIG. 4A) with a peak at around 10°, The difference between the first peak response and the second peak response (e.g., in FIG. 5B, approximately 20°) can be used to calculate an adjustment that can be made to focus a main lens that provides light to the integrated chip. For example, from the peak response of the first phase detection pixel and the second phase detection pixel, supporting logic can determine a focal length of a lens configured to focus light onto the integrated chip.

Figure 5A:
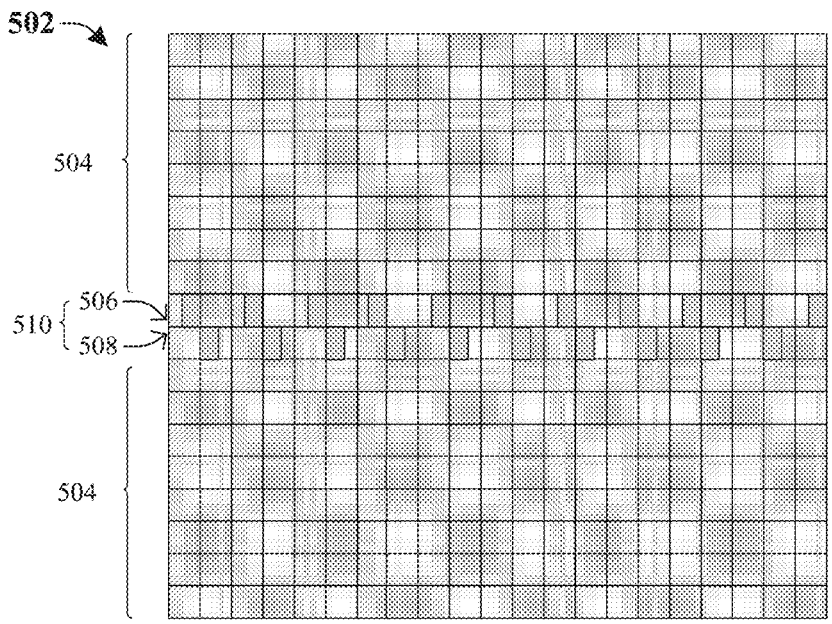
FIG. 5A illustrates an image sensor pattern of some embodiments.

FIG. 5A illustrates an image sensor pattern 502 of some embodiments. A phase detection pixel array 510 incorporated in an image sensor pixel array 504 according to some embodiments. A first row 506 of the phase detection pixel array 510 comprises a plurality of phase detection pixels having phase detection components smaller than color filters and shifted in a first direction. A second row 508 comprises a plurality of phase detection pixels having phase detection components smaller than color filters and shifted in a second direction that is opposite to the first direction (i.e. the first and second rows 506, 508 have mirrored phase detection components).

Figure 5B:
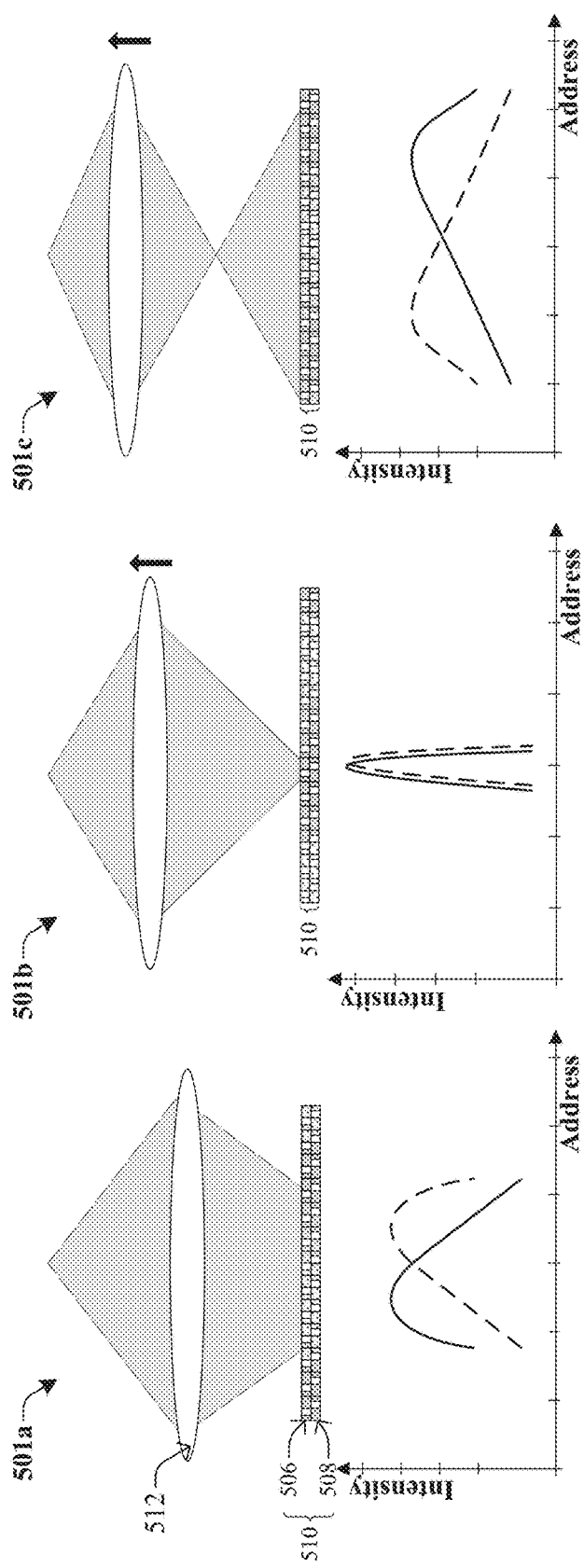
FIG. 5B illustrates some embodiments of intensity response curves of a phase detection pixel array of FIG. 5A over addresses.

FIG. 5B illustrates some embodiments of intensity response curves of a phase detection pixel array 510 of FIG. 5A over addresses (i.e., lateral locations on the phase detection pixel array 510). Although the disclosed detection pixel array is described as having a focal adjustment determined based on intensity response curves shown in FIG. 5B, it will be appreciated that determination of the focal adjustment is not limited to the methodology described by the intensity response curves shown in FIG. 5B.

Graph 501a shows a first out of focus situation where the lens 512 is too far from the object. A solid curve shows intensity response of the first plurality of phase detection pixels of the first row 506 and a dashed curve shows intensity response of the second plurality of phase detection pixels of the second row 508. Response peaks of the first row 506 and the second row 508 are located at opposite directions from the center of the lens 512. Out of focus conditions can be then computed by processing the response curves. Graph 501b shows a focus situation where the lens 512 focuses an object at a focal point located on the phase detection pixel array 510. Similar to graph 501a, a solid curve shows intensity response of the first plurality of phase detection pixels of the first row 506 and a dashed curve shows intensity response of the second plurality of phase detection pixels of the second row 508. Response peaks of the first row 506 and the second row 508 are substantially overlapped at a position directly under the center of the lens 512. Response curves are sharpest as incident radiance is converged at the focus point, at which address the response peaks are overlapped. Graph 501c shows a second out of focus situation that the lens 512 is too near from the object. Response peaks of the first row 506 (solid curve) and the second row 508 (dashed curve) locate at opposite directions from the center of the lens 512 but are exchanged to opposite directions comparing to graph 501b. Thus, from response curves, out of focus directions (too far or too near) can be computed based on response curves.

FIGS. 6-10 show a series of cross-sectional views 600-1000 of some embodiments of a method for manufacturing an integrated circuit at various stages of manufacture. Although cross-sectional views 600-1000 are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 6:
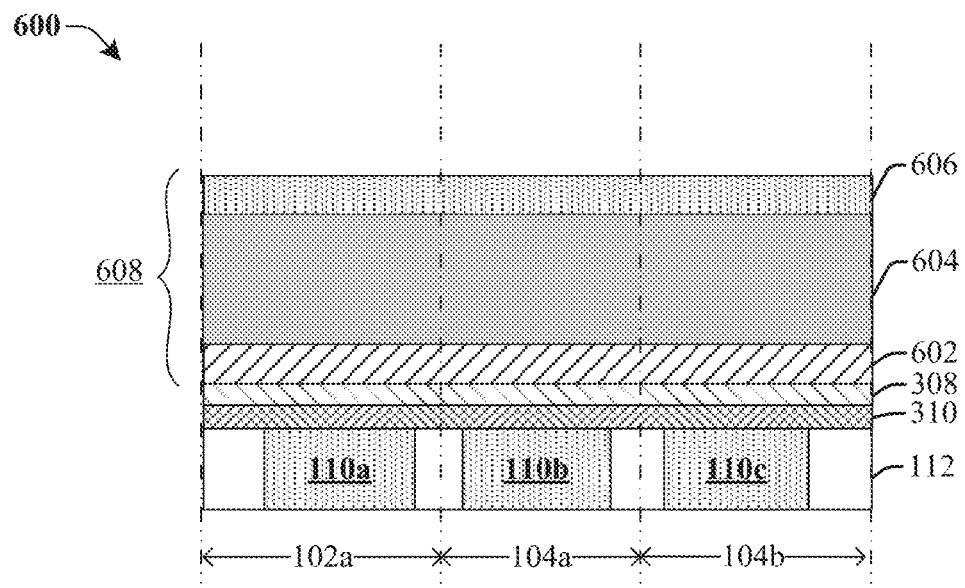
FIGS. 6-10 illustrate a series of cross-sectional views of some embodiments of a method for manufacturing an integrated circuit at various stages of manufacture.

As shown in cross-sectional view 600 of FIG. 6, photodiodes 110a, 110b and 110c corresponding to pixels 102a, 104a, and 104b under manufacture are arranged in a semiconductor substrate 312. In some embodiments, the semiconductor substrate 312 is part of an IC and is arranged on a backside of the IC. Also shown by FIG. 6, an antireflective layer 310 and/or a buffer layer 308 are formed over the semiconductor substrate 312. For example, the buffer layer 308 may be formed overlying the antireflective layer 310. Further, a grid structure 608 having one or more grid layer(s) 602, 604, 606 is formed over the antireflective layer 310 and/or the buffer layer 308. For example, the grid layer(s) 602, 604, 606 may be restricted to a metal grid layer 602. As another example, the grid layer(s) may comprise the metal grid layer 602 and a dielectric grid layer 604 overlying the metallic grid layer 602. As yet another example, the grid layer(s) 602, 604, 606 may comprise the metal grid layer 602, the dielectric grid layer 604, and a hard mask grid layer 606 overlying the dielectric grid layer 604. In some embodiments, the antireflective layer 310 and/or the buffer layer 308, as well as the grid layer(s) 602, 604, 606, are sequentially formed using one or more of vapor deposition (e.g., chemical vapor deposition (CVD)), thermal oxidation, spin coating, and the like.

Figure 7:
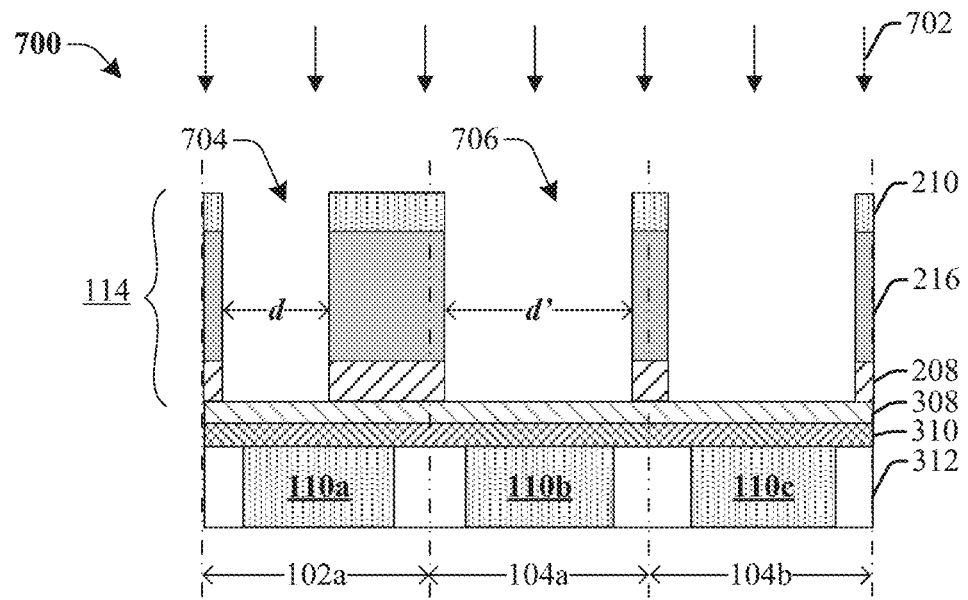

As shown in cross-sectional view 700 of FIG. 7, a first etch is performed into the grid layer(s) 602, 604, 606 to form an optical isolation grid structure 114 comprising one or more of a metal grid 208, a dielectric grid 216, and a hard mask grid 210. The optical isolation grid structure 114 laterally surrounding an phase detection opening 704 and an image sensing opening 706 corresponding to a phase detection pixel and an image sensing pixel under manufacture. In some embodiments, the phase detection opening 704 has a width d less than a half of a width d' of the image sensing opening 706.

The process for performing the first etch may include forming a photoresist layer (not shown) masking regions of the grid layer(s) 602, 604, 606 corresponding to the optical isolation grid structure 114. One or more etchants 702 may then be sequentially applied to the grid layer(s) 602, 604, 606 to define the optical isolation grid structure 114. In some embodiments, after the optical isolation grid structure 114 is fully defined, the photoresist layer is removed. In other embodiments, after the hard mask grid 210 is defined, but before etching other grid layers (e.g., the dielectric grid layer 604), the photoresist layer is removed.

Figure 8:
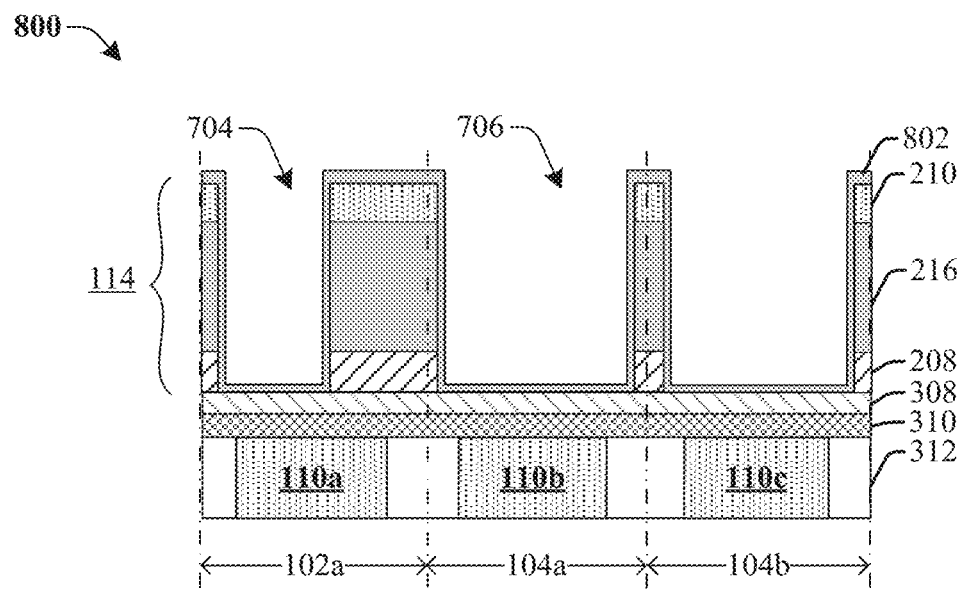

As illustrated in cross-sectional view 800 of FIG. 8, in some embodiments, the openings 704, 706 in the optical isolation grid structure 114 are lined by a liner layer 802. In some embodiments, the liner layer 802 is formed using vapor deposition and/or thermal oxidation.

Figure 9:
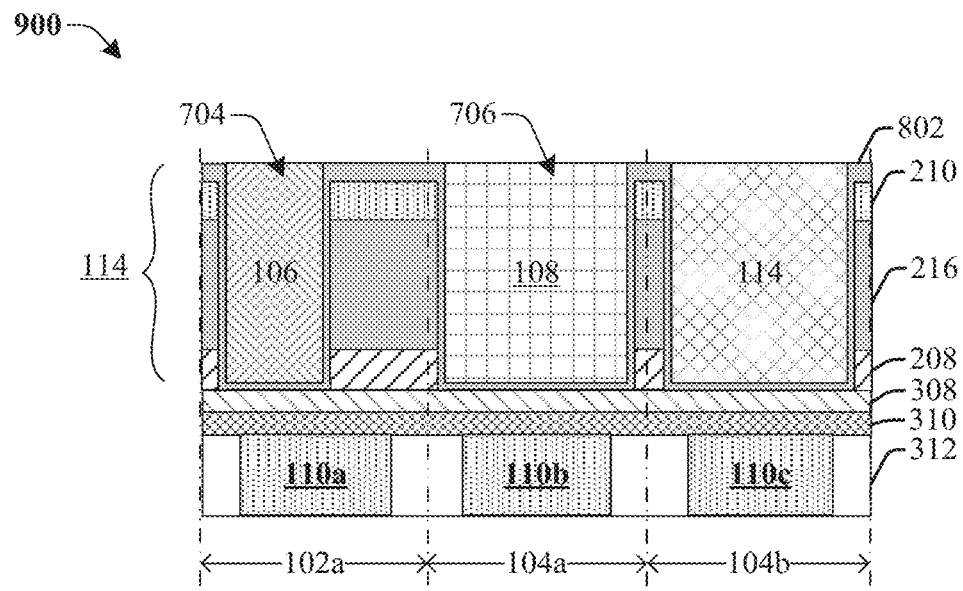

As illustrated in cross-sectional view 900 of FIG. 9, a phase detection component 106 is formed in the phase detection opening 704 and a color filter 302a is formed in the image sensing opening 706. In some embodiments, the phase detection component 106 and the color filter 302a fill the openings 704, 706 with upper surfaces approximately even with an upper surface of the optical isolation grid structure 114 and/or the liner layer 802. The color filter 302a is typically assigned colors, such as red, green, and blue, and configured to transmit the assigned colors while blocking other colors. Another color filter 304a next to the color filter 302a can be assigned a different color. In some embodiments, the phase detection component 106 can comprise a same material as a color filter 302a. While in some other embodiments, the phase detection component 106 may comprise an optically transparent material. Also, in some embodiments, the phase detection component 106 can be made of low refractive index (low-n) material and have a refractive index smaller than a refractive index of the first color filter 108. In some embodiments, the phase detection component 106 has a refractive index substantially equal to the refractive index of the dielectric grid layer 604.

The process for forming the phase detection component 106 and the color filter 302a may include, for each of the color assignments, forming a color filter layer and patterning the color filter layer. The color filter layer may be formed so as to fill the openings 704, 706 and to cover the optical isolation grid structure 114. The color filter layer may then be planarized and/or etched back to approximately even an upper surface of the optical isolation grid structure 114 and/or the liner layer 802, before patterning the color filter layer.

Figure 10:
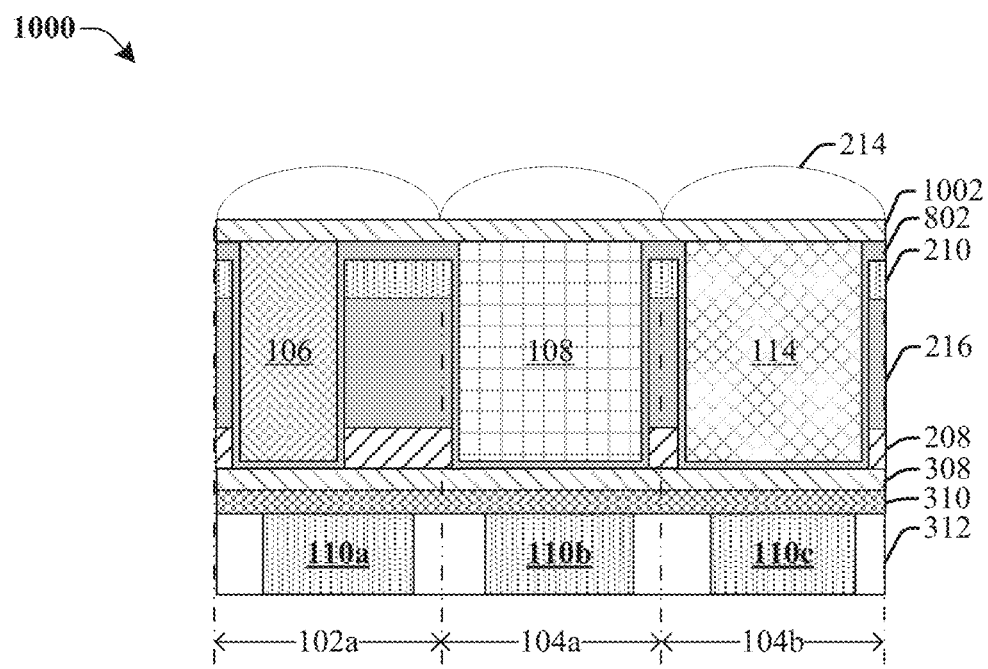

As illustrated in cross-sectional view 1000 of FIG. 10, in some embodiments, a second buffer layer 1002 can be formed over the phase detection component 106 and the color filter 302a, and microlenses 214 can be formed over the second buffer layer 1002. The second buffer layer 1002 may be formed by, for example, one or more of vapor deposition, atomic layer deposition (ALD), spin coating, and the like. The microlens 214 may be, for example, formed of the same material as the second buffer layer 1002 and/or formed using, for example, one or more of vapor deposition, ALD, spin coating, and the like. After forming a microlens layer, the microlens layer is patterned to define footprints of corresponding microlenses. For example, a photoresist layer masking select regions of the microlens layer may be formed over the microlens layer, used as a mask during a etch of the microlens layer, and subsequently removed. With the microlens layer patterned, one or more reflow and/or heating processes can be performed on the patterned microlens layer to round corners of the patterned microlens layer.

Figure 11:
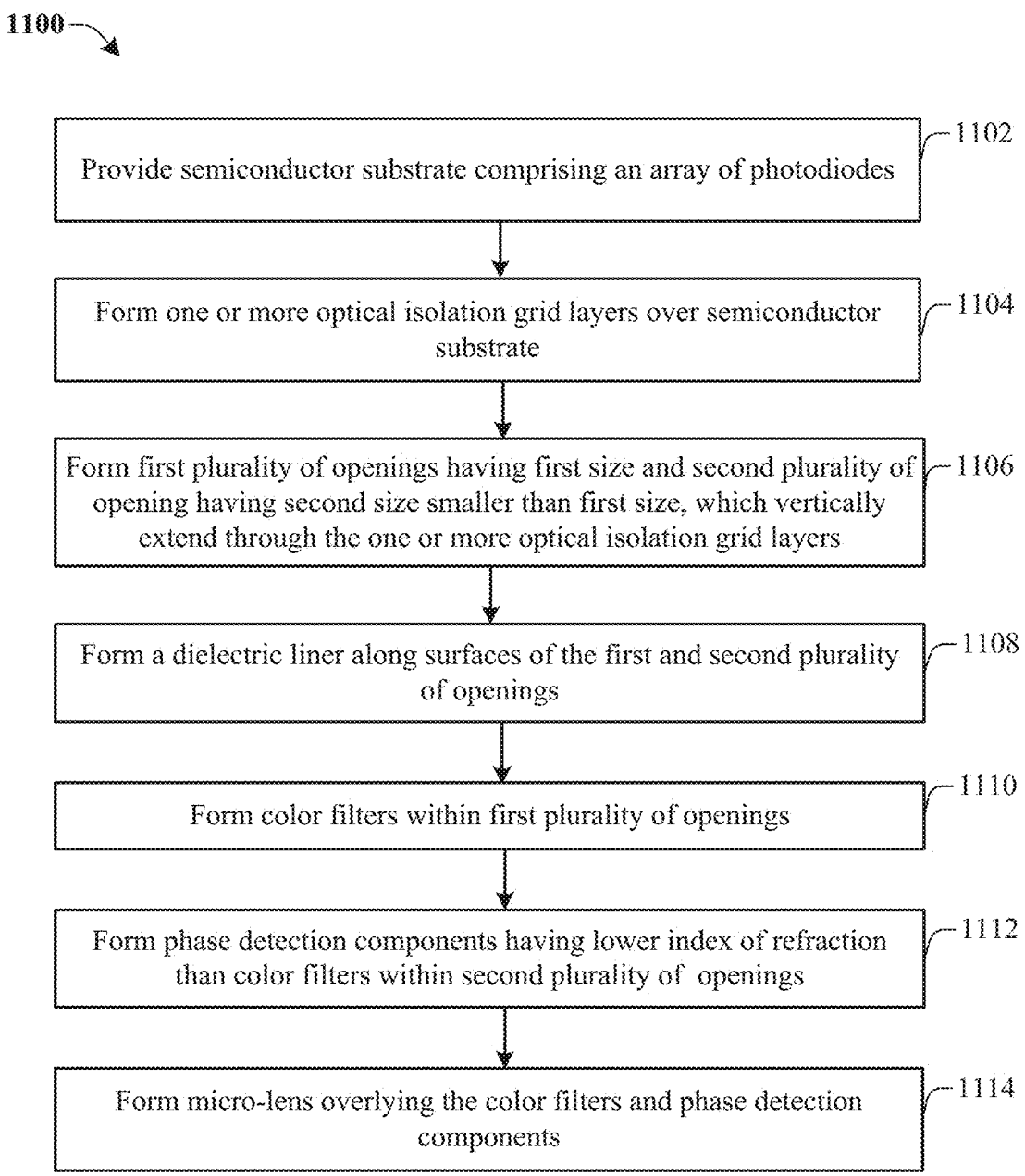
FIG. 11 illustrates a flow diagram of some embodiments of a method for manufacturing an integrated circuit including image sensing pixels and phase detection pixels.

FIG. 11 shows a flow diagram 1100 of some embodiments of a method for manufacturing an integrated circuit including image sensing pixels and phase detection pixels.

At act 1102, a semiconductor substrate comprising an array of photodiodes is provided. Some embodiments of a cross-sectional view corresponding to act 1102 are illustrated in FIG. 6.

At act 1104, one or more optical isolation grid layers are formed over the semiconductor substrate. In some embodiments, the one or more optical isolation grid layers may comprise a stack of a metal layer, a dielectric layer, and a hard mask layer formed over the array of photodiodes. Some embodiments of a cross-sectional view corresponding to act 1104 are illustrated in FIG. 6.

At act 1106, an etch is performed into the grid layer(s) to form a first plurality of openings having a first size and a second plurality of openings having a second size smaller than the first size. The first plurality of openings and the second plurality of openings extend through the one or more optical isolation grid layers. In some embodiments, the first plurality of openings have a width that is greater than or equal to twice a width of the first plurlaity of openings. Some embodiments of a cross-sectional view corresponding to act 1106 are illustrated in FIG. 7.

At act 1108, in some embodiments, a dielectric liner is formed along surfaces of the first and second plurality of openings in the grid layer(s). Some embodiments of a cross-sectional view corresponding to act 1108 are illustrated in FIG. 8.

At act 1110, color filters are formed in the first plurality of openings. Some embodiments of a cross sectional-view corresponding to act 1110 are illustrated in FIG. 9.

At act 1112, phase detection components are formed in the second plurality of openings. The phase detection components have an index of refraction that is less than the index of refraction of the color filters. Some embodiments of a cross-sectional view corresponding to act 1112 are illustrated in FIG. 9.

At act 1114, microlenses are formed over the color filters and the phase detection components. Some embodiments of a cross-sectional view corresponding to act 1112 are illustrated in FIG. 10.

Thus, as can be appreciated from above, the present disclosure relates to an image sensor having autofocus function and associated methods. The image sensor comprises phase detection pixels for autofocus and image sensing pixels for image capture. Width center axes of a pair of phase detection pixels are mirrored shifted with reference of width center axis of the image sensing pixels to receive shifted angular response. In some embodiments, a width of a phase detection pixel is around a half smaller than that of an image sensing pixel, to achieve a sharp angular response. In some embodiments, a phase detection pixel comprises low-n material to reduce unwanted total internal reflection. In some other embodiments, a phase detection pixel comprises an optically transparent material to receive radiance of a broad wavelength range.

In some embodiments, the present disclosure relates to an integrated circuit. The integrated circuit comprises a photodiode array comprising a plurality of photodiodes disposed within a semiconductor substrate and a composite grid overlying the photodiode array and having a first plurality of openings and a second plurality of openings extending vertically through the composite grid. The integrated circuit further comprises an image sensing pixel array comprising a plurality of color filters disposed in the first plurality of openings. The integrated circuit further comprises a phase detection pixel array comprising a plurality of phase detection components disposed in the second plurality of openings, wherein the plurality of phase detection components are respectively smaller than the plurality of color filters.

In other embodiments, the present disclosure relates to an integrated circuit. The integrated circuit comprises an image sensing pixel comprising a color filter overlying a first photodiode arranged in a semiconductor substrate. The integrated circuit further comprises a phase detection pixel having a phase detection component overlying a second photodiode arranged in the semiconductor substrate. The integrated circuit further comprises a composite grid arranged between the image sensing pixel and the phase detection autofocus pixel and comprising a low refractive index (low-n) dielectric grid disposed on a metal grid and a hard mask grid disposed on the dielectric grid. The composite grid has a first width along a first side of the image sensing pixel facing the phase detection autofocus pixel and a second width, smaller than the first width, along a second side of the image sensing pixel opposite the first side.

In yet other embodiments, the present disclosure relates to a method for manufacturing an integrated circuit for image sensors. The method comprises forming a stack of a metal layer, a dielectric layer and a hard mask layer over a photodiode array comprising a plurality of photodiodes arranged within a substrate. The method further comprises performing an etch through the hard mask layer, the dielectric layer and the metal layer to form a first plurality of openings and a second plurality of openings overlying the plurality of photodiodes, wherein widths of the second plurality of openings are less than half of widths of the first plurality of openings. The method further comprises forming color filters in the first plurality of openings and phase detection components in the second plurality of openings, the color filters having a refractive index greater than a refractive index of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a photodiode array comprising a plurality of photodiodes disposed within a semiconductor substrate;
a composite grid overlying the photodiode array and having a first plurality of openings and a second plurality of openings extending vertically through the composite grid;
an image sensing pixel array comprising a plurality of color filters disposed in the first plurality of openings; and
a phase detection pixel array comprising a plurality of phase detection components that are smaller than the plurality of color filters and that have a low refractive index (low-n) material with a refractive index (n) smaller than a refractive index of the plurality of color filters, wherein the phase detection components are disposed in the second plurality of openings.

2. The integrated circuit of claim 1, wherein the first plurality of openings respectively have a width that is more than twice as large as a width of the second plurality of openings.

3. The integrated circuit of claim 1, wherein the refractive index of the low refractive index (low-n) material is smaller than a refractive index of a micro-lens overlying the phase detection component.

4. The integrated circuit of claim 1, wherein the phase detection components comprise an optically transparent material.

5. The integrated circuit of claim 1, wherein the composite grid comprises a silicon dioxide grid disposed on a metal grid and a silicon nitride or silicon oxynitride grid disposed on the silicon dioxide grid.

6. The integrated circuit of claim 1, further comprising:
a plurality of interconnect wires disposed within a dielectric layer arranged on an opposite side of the semiconductor substrate as the composite grid.

7. The integrated circuit of claim 1,
wherein a first phase detection component and a first color filter are arranged in a first row and a second color filter and a second phase detection component are arranged in a second row;
wherein the first phase detection component and the second color filter are aligned along sides facing a first direction and offset along sides facing a second direction opposite the first direction; and
wherein the first color filter and the second phase detection component are offset along sides facing the first direction and aligned along sides facing the second direction.

8. The integrated circuit of claim 7, wherein the first color filter is configured to filter a different spectrum of radiation than the second color filter.

9. The integrated circuit of claim 1, wherein width center axes of the color filters are respectively aligned with corresponding photodiodes while width center axes of the phase detection components are respectively not aligned with corresponding photodiodes.

10. The integrated circuit of claim 1, wherein the composite grid comprises a first opening having a first phase detection component arranged on a first side of the composite grid and a second opening having a second phase detection component arranged on a second side of the composite grid that faces an opposite direction as the first side.

11. The integrated circuit of claim 10, further comprising:
an image signal processor configured to compute radiation intensity passing through the first phase detection component and the second phase detection component and generate a signal related to focus conditions of an image sensor.

12. An integrated circuit of an image sensor, comprising:
an image sensing pixel comprising a color filter overlying a first photodiode arranged in a semiconductor substrate;
a phase detection pixel having a phase detection component overlying a second photodiode arranged in the semiconductor substrate, wherein the phase detection component has a lower refractive index than the color filter; and
a composite grid arranged between the image sensing pixel and the phase detection pixel and comprising a dielectric grid disposed on a metal grid and a hard mask grid disposed on the dielectric grid, wherein the composite grid has a first width along a first side of the image sensing pixel facing the phase detection pixel and a second width, smaller than the first width, along a second side of the image sensing pixel opposite the first side;
wherein the color filter extends through the composite grid and the phase detection component extends through the composite grid.

13. The integrated circuit of claim 12, further comprising:
a second phase detection pixel configured to receive a peak intensity of incoming light at a first incident angle; and
wherein the phase detection pixel is configured to receive a peak intensity of incoming light at a second incident angle different than the first incident angle.

14. The integrated circuit of claim 13, further comprising:
an image signal processor configured to compute received light intensities of the phase detection pixels, and to output a signal to adjust focus of the image sensor.

15. The integrated circuit of claim 13, wherein the phase detection pixel and the second phase detection pixel are spatially offset along a first direction and along a second direction perpendicular to the first direction.

16. The integrated circuit of claim 12, wherein the color filter has a width that is more than twice a width of the phase detection component.

17. The integrated circuit of claim 12, wherein the phase detection component is a same material as the dielectric grid.

18. An integrated circuit, comprising:
a stack of a metal layer, a dielectric layer and a hard mask layer disposed over a photodiode array arranged within a substrate; and a plurality of color filters overlying a first plurality of photodiodes and extending through the stack of the hard mask layer, the dielectric layer and the metal layer; and a plurality of phase detection components overlying a second plurality of photodiodes and extending through the stack of the hard mask layer, the dielectric layer and the metal layer;

wherein a width of the plurality of phase detection components is less than half of a width of the plurality of color filters;

wherein the color filters having refractive indexes greater than a refractive index of the phase detection components.

19. The integrated circuit of claim 18, wherein the phase detection components have a refractive index substantially equal to the refractive index of the dielectric layer.

20. The integrated circuit of claim 18, wherein the color filters and the phase detection components are disposed laterally offset from the corresponding photodiodes so the metal layer between one phase detection component and one neighboring color filter are wider than the metal layer between the phase detection component and another neighboring color filter.

* * * * *